United States Patent
Septon et al.

(10) Patent No.: US 12,224,550 B2
(45) Date of Patent: Feb. 11, 2025

(54) WAFER LEVEL ANALYSIS FOR VCSEL SCREENING

(71) Applicant: MELLANOX TECHNOLOGIES, LTD., Yokneam (IL)

(72) Inventors: Tali Septon, Haifa (IL); Itshak Kalifa, Bat-Yam (IL); Elad Mentovich, Tel Aviv (IL); Matan Galanty, Korzim (IL); Yaakov Gridish, Yoqneam Ilit (IL); Hanan Shumacher, Kohav Yair (IL); Vadim Balakhovski, Herzliya (IL); Juan Jose Vegas Olmos, Solrød Strand (DK)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 742 days.

(21) Appl. No.: 17/156,902

(22) Filed: Jan. 25, 2021

(65) Prior Publication Data

US 2022/0239056 A1 Jul. 28, 2022

(51) Int. Cl.
*H01S 5/00* (2006.01)

(52) U.S. Cl.
CPC .................. *H01S 5/0042* (2013.01)

(58) Field of Classification Search
CPC .............. G01R 31/26; G01R 31/2635; G01R 31/2648; G01R 31/31702; H01S 5/0014; H01S 5/0035; H01S 5/0042; H01S 5/18–18397; H01S 5/423; H01S 5/18394; H01S 2301/00
See application file for complete search history.

(56) References Cited

U.S. PATENT DOCUMENTS 5,446,537 A * 8/1995 Yoshida ............. G01R 31/2642
356/256
6,013,537 A * 1/2000 Kuchta ............... G01R 31/2831
438/18

(Continued)

FOREIGN PATENT DOCUMENTS

AU 611523 B2 * 6/1991
CN 1568431 A * 1/2005 ........... G01R 31/275

(Continued)

OTHER PUBLICATIONS

Song et al., Opportunities for PAM4 Modulation. Huawei Technologies Co., Ltd. Jan. 2014 (Year: 2014).*

(Continued)

*Primary Examiner* — Reena Aurora
(74) *Attorney, Agent, or Firm* — Sheridan Ross P.C.

(57) ABSTRACT

A method and system for analyzing Vertical-Cavity Surface-Emitting Lasers (VCSELs) on a wafer are provided. An illustrative method of is provided that includes: applying a stimulus to each of the plurality of VCSELs on the wafer; measuring, for each of the plurality of VCSELs, two or more VCSEL parameters responsive to the stimulus; correlating the measured two or more VCSEL parameters to define a value of a common performance characteristic; and identifying clusters of VCSELs having similar values of the common performance characteristic. The clusters of VCSELs may be determined to collectively meet or not meet an optical performance requirement defined for the VCSELs on the wafer.

20 Claims, 13 Drawing Sheets
(11 of 13 Drawing Sheet(s) Filed in Color)

(56) References Cited

U.S. PATENT DOCUMENTS

| | | | | |
|---|---|---|---|---|
| 6,273,400 | B1* | 8/2001 | Kuchta | G01R 31/2831 |
| | | | | 257/94 |
| 6,879,014 | B2* | 4/2005 | Wagner | H01L 31/1872 |
| | | | | 257/434 |
| 7,184,626 | B1* | 2/2007 | Gunn, III | G02B 6/29395 |
| | | | | 385/37 |
| 7,295,590 | B2* | 11/2007 | Crews | H01S 5/0261 |
| | | | | 372/38.1 |
| 7,378,861 | B1* | 5/2008 | Malendevich | G02B 6/30 |
| | | | | 324/754.23 |
| 7,482,828 | B2* | 1/2009 | Lalonde | G01R 31/2884 |
| | | | | 324/762.05 |
| 9,166,367 | B2* | 10/2015 | Zhu | H01S 3/1306 |
| 10,038,304 | B2* | 7/2018 | Joseph | H01S 5/423 |
| 10,522,977 | B1 | 12/2019 | Mentovich et al. | |
| 10,547,387 | B2 | 1/2020 | Vegas-Olmos et al. | |
| 10,686,528 | B2 | 6/2020 | Franck et al. | |
| 2002/0145139 | A1* | 10/2002 | Wagner | H01L 31/03682 |
| | | | | 257/53 |
| 2006/0104328 | A1* | 5/2006 | Crews | H01S 5/0261 |
| | | | | 372/50.124 |
| 2006/0274796 | A1* | 12/2006 | Cheng | H01S 5/02212 |
| | | | | 372/38.01 |
| 2007/0013400 | A1* | 1/2007 | Lalonde | G01R 31/2884 |
| | | | | 324/754.03 |
| 2015/0110142 | A1* | 4/2015 | Zhu | H01S 3/1306 |
| | | | | 372/38.02 |
| 2015/0155686 | A1* | 6/2015 | Berkram | H01S 5/042 |
| | | | | 372/29.021 |
| 2015/0340841 | A1* | 11/2015 | Joseph | H01S 5/04257 |
| | | | | 372/50.12 |
| 2018/0287709 | A1 | 10/2018 | Lu et al. | |
| 2022/0239056 | A1* | 7/2022 | Septon | H01S 5/0042 |
| 2022/0239071 | A1* | 7/2022 | Septon | H01S 5/423 |

FOREIGN PATENT DOCUMENTS

| | | | | |
|---|---|---|---|---|
| GB | 2418487 | | 3/2006 | |
| WO | WO-2007095555 | A2* | 8/2007 | G01R 31/2642 |
| WO | WO-2010113066 | A1* | 10/2010 | G01R 31/2635 |

OTHER PUBLICATIONS

Tektronix. Testing Laser Diode Modules and VCSELs with the 2601B-Pulse System SourceMeter® Instrument and KickStart Instrument Control Software. Oct. 1, 2020. (Year: 2020).*

Dale Cigoy. Laser Diode and VCSEL Test: High-throughput DC production test techniques for laser-diode modules and VCSELs. www.laserfocusworld.com. Sep. 2013 (Year: 2013).*

Official Action for U.S. Appl. No. 17/156,970, dated May 2, 2023 16 pages.

Notice of Allowance for U.S. Appl. No. 17/156,970, dated Nov. 24, 2023 12 pages.

Supplemental Notice of Allowance for U.S. Appl. No. 17/156,970, dated Dec. 6, 2023 8 pages.

* cited by examiner

WAFER LEVEL ANALYSIS FOR VCSEL SCREENING

FIELD OF THE DISCLOSURE

The present disclosure is generally directed toward testing and sorting and, in particular, toward wafer testing and sorting.

BACKGROUND

One of the applications of Vertical-Cavity Surface-Emitting Lasers (VCSELs) is to transmit optical signals. These signals require modulation of the VCSEL to vary its emitted power. In digital applications, data is encoded as ones and zeros, corresponding to pulses of high or low power, respectively.

Due to their small size, high bandwidth, and low power consumption, VCSELs are desirable components for performing light modulation in high-speed interconnect solutions, for the design of optical transmitters and many other applications. Large-scale production of VCSELs with high yield exponentially reduces the cost per VCSEL.

Accurate VCSEL design affords a high bit rate with proven performance. However, the conventional process for the development of a new VCSEL design (intended to deliver specification and performance for 50 Gbaud PAM4 optical interconnects) include simulations, process development, and multiple tests, which are complicated and costly.

Due to uncontrolled fabrication processes, together with inherent design constrains, the key physical attributes of the VCSEL design may vary over devices within the same LOT/wafer. Such variation may greatly affect the dynamic behavior of the VCSEL. For example, variations in aperture diameter and the bottom/top mirror's reflectivity will affect the bandwidth, damping, overshoots, and settling time. As a result, performance under modulation, such as the timing jitter and the Bit Error Rate (BER), will also be negatively impacted. Also, a desirable feature of a laser is the constant amplitude. Right after the laser turns on, the amplitude varies for a time and then stabilizes to a constant value. The frequency before the laser stabilizes is the relaxation oscillation frequency, which should be damped.

These variations are directly reflected by the distribution of the measured Direct Current (DC) sort values. Therefore, by selectively screening DC values of an existing design, it is possible to choose VCSELs with bandwidth and damping optimized for a given performance (e.g., 50 Gbaud PAM4), without the need for the entire development process, required from a new VCSEL design.

One of the existing methods of increasing the yield from a wafer is product binning, a process during which the finished products are categorized, based on their characteristics. In order to undergo binning, manufactured products require testing, usually performed by machines in bulks. Binning allows large variances in performance to be condensed into a smaller number of marketed designations, where products sold under a certain designation must meet that designation at a minimum. However, effective VCSEL binning requires simulations and multiple tests, which are complicated to perform.

BRIEF SUMMARY

To address the above-noted shortcomings and challenges of VCSEL design, there is a need for a VCSEL testing method that allows improving the binning process and thereby leads to a better utilization of the fabricated devices, which in turn, increases the overall yield of VCSEL design and production.

It is, therefore, an object of the present disclosure to provide an effective VCSEL binning method for large-scale wafer level analysis, sorting and screening, using simple and available measurements.

It is another object of the present disclosure to provide an effective VCSEL binning method that increases the yield from a wafer and improves the utilization of the fabricated devices.

It is a further object of the present disclosure to provide an effective VCSEL binning method that will increase the probability of meeting required optical performance of selected VCSELs, by predicting the dynamic features of a single VCSEL die or of an array of VCSELs in a short time, without requiring extensive lab resources and manpower.

In one aspect, the disclosure relates to a method for binning VCSELs having individual performance characteristics on a wafer, comprising measuring two or more VCSEL parameters responsive to DC or small signal measurement values for each VCSEL on said wafer, correlating said two or more parameters to define a common performance characteristic, and identifying areas of the wafer containing clusters of VCSELs having similar values of said common performance characteristic.

In one embodiment of the disclosure the small signal values consist of AC signals at an operation point in which the VCSEL behaves substantially linearly. In another embodiment the value of the common performance characteristic comprises a threshold value, and in a further embodiment the value of the common performance is the aperture size of the VCSEL.

In some embodiments of the disclosure, the value of the common performance is obtained by correlating the optical power L at operation current (L_op), the threshold current (Ith), and the Slope Efficiency (SE).

In one specific embodiment of the disclosure the method comprises: for each VCSEL on a wafer, measuring representative parameters of said VCSEL, of predetermined DC or small signal values; calculating a correlation between selected sub-groups of the representative parameters; identifying areas on said wafer containing clusters of VCSELs, for which the calculated correlation meets a first condition; and determining an electro-optical property value or a reliability value associated with each cluster, based on the calculated correlation.

Examples of the electro-optical property value are an aperture diameter, or mirrors reflectivity.

In one embodiment the method further comprises: screening clusters of VCSELs on said wafer, having an aperture diameter that meets a second condition and/or mirrors reflectivity that meets a third condition; and associating screened clusters to optical performance requirements from each of said VCSELs in a screened cluster, such that each screened cluster has at least a certain probability to meet its corresponding optical performance requirements.

Various optical performance requirements can be selected for performing the method of the disclosure. Conveniently, but without limitation, at least a portion of the optical performance requirements are selected from the group of:
  Expected data bit rate
  Expected bandwidth
  Expected modulation order
  Damping factor of the relaxation oscillations
  Overshoots response
  Settling time Rise time
Fall time
Bandwidth (BW)
Relative Intensity Noise (RIN)
Photon lifetime
Timing jitter
BER
Optical Modulation Amplitude (OMA)

In one embodiment, the bit rate is greater than 50 Gbaud Pulse Amplitude Modulation 4-level (PAM4). In another embodiment the modulation order is PAM4, PAM8 or PAM16.

Various VCSEL parameters can be selected for performing the method of the disclosure. According to one embodiment, the VCSEL parameters are selected from the group of:
Threshold current (Ith)
Slope Efficiency (SE)
Optical power L at operation current (L_op)
Spectral bandwidth (WL_SBW)
Photon lifetime
Forward Voltage (Vf)
Resistance (Rs)
RIN
Scattering matrix parameters measurements (S-Parameters), which describe the response of an N-port network to signal(s) incident to any or all of the ports The correlation between selected pairs of representative parameters can be expressed in many ways apparent to the skilled person. For instance, the correlation between selected pairs of representative parameters may be expressed by a correlation matrix, which expresses the correlation coefficient calculated using the Pearson method.

The ranges of VCSEL parameters employed in embodiments of the disclosure can be in a broad range. Illustrative examples of such ranges at room temperature include, without limitation:
0.8 mA<Ith<1.1 mA
0.56 mW/mA<SE<0.68 mW/mA
4.05 mW<L_op<4.6 mW
0.7<WL_SBW<1.2 where (k=1)

For example, the bin split can be targeted for the best high-speed bit rate performance at PAM4 with:
0.85 mA<Ith<0.95 mA
0.56 mW/mA<SE<0.62 mW/mA
4.05 mW<L_op<4.35 mW
0.7<WL_SBW<1 where (k=1)

In another example, for best high-speed bit rate performance using Non-Return-to-Zero (NRZ) modulation format, the following bin split can be used:
0.8 mA<Ith<0.9 mA
0.62 mW/mA<SE<0.68 mW/mA
4.35 mW<L_op<4.65 mW
0.7<WL_SBW<1.2 where (k=1)

If a lower bit rate performance is desired (e.g. 15-20 Gbaud) a damped signal can be achieved using:
0.45 mA<Ith<0.57 mA
0.35 mW/mA<SE<0.38 mW/mA
3.5 mW<L_op<3.7 mW
WL_SBW<1.2

In addition to the methods described above, other methods for analyzing a plurality of VCSELs having individual performance characteristics on a wafer are disclosed that include: applying a stimulus to each of the plurality of VCSELs on the wafer; measuring, for each of the plurality of VCSELs, two or more VCSEL parameters responsive to the stimulus; correlating the measured two or more VCSEL parameters to define a value of a common performance characteristic; and identifying clusters of VCSELs having similar values of the common performance characteristic.

In another example, a system for analyzing a wafer having VCSELs is disclosed to include: a VCSEL stimulator that applies a stimulus to at least some VCSELs on the wafer; a VCSEL measurement unit that measures two or more VCSEL parameters responsive to the stimulus; a processor; and memory coupled with the processor that includes instructions which, when executed by the processor, enable the processor to: correlate the measured two or more VCSEL parameters to define a value of a common performance characteristic; and identify clusters of VCSELs on the wafer that have values of the common performance characteristic within a predefined amount.

Additional features and advantages are described herein and will be apparent from the following Description and the figures.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

The present disclosure is described in conjunction with the appended figures, which are not necessarily drawn to scale.

DETAILED DESCRIPTION

Figure 1:
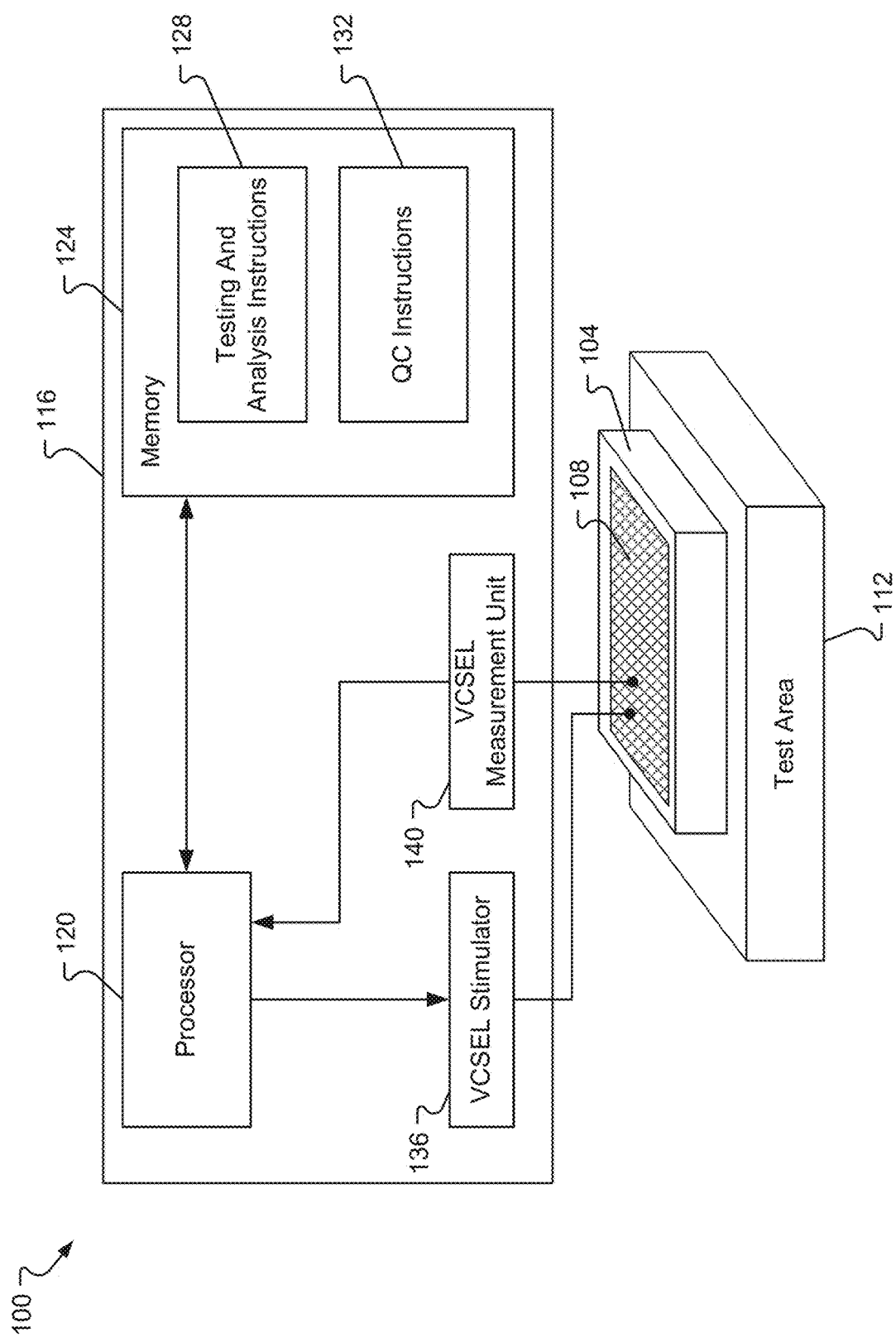
FIG. 1 is a block diagram of a system for measuring and analyzing VCSELs on a wafer in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

It will be appreciated from the following description, and for reasons of computational efficiency, that the components of the system can be arranged at any appropriate location within a distributed network of components without impacting the operation of the system.

Furthermore, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a PCB, or the like.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means: A alone, B alone, C alone, A and B together, A and C together, B and C together, or A, B and C together.

The term "automatic" and variations thereof, as used herein, refers to any appropriate process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," and "compute," and variations thereof, as used herein, are used interchangeably and include any appropriate type of methodology, process, operation, or technique.

Various aspects of the present disclosure will be described herein with reference to drawings that are schematic illustrations of idealized configurations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-9, various systems, circuits, and methods will be described for effective VCSEL analysis and binning. The disclosed VCSEL analysis and binning methods may increase the probability of meeting required optical performance requirements of selected VCSELs by predicting the dynamic features of a single VCSEL die or of an array of VCSELs in a short time, without requiring extensive lab resources and labor. The prediction can be based on an accurate analysis of the correlation between physical attributes of the VCSELs, which can be reflected by the measured Direct Current (DC) values over LOT/wafer of VCSELs, so as to significantly increase yields and allows defining specifications of new lines of products.

In one aspect, the present disclosure proposes a process of selecting and sorting groups (or clusters) of VCSELs that will assure a desired performance, such as, for example, meeting a data rate which exceeds 50 Gbaud/Sec.

The VCSEL's optical performance may be characterized by one of more of:
  Expected data bit rate
  Expected bandwidth under modulation
  Expected modulation order (e.g., PAM 4, PAM 8, PAM 16)
  Damping factor of the relaxation oscillations
  Overshoots response (e.g., pulse rising edges under modulation)
  settling time (e.g., the time it takes for the output to converge to a steady state power)
  BER during modulation
  timing jitter (e.g., the transition region width at a given BER)
  S—Parameters
  RIN
  Spectral BW The basic measurements are based on the SORT procedure (also known as the Electronic Die Sort (EDS), Circuit Probe (CP), and the Wafer Test (WT)), known to the persons skilled in the field, which is a large-scale measurement process over a wafer in an automated process. It is a simple electrical test that is performed on a silicon die while in a wafer form, the main purpose of which is to identify the non-functional dies and thereby avoid assembly of those dies into packages. In many cases, wafer sort is a simple and quick test that focuses on a few parameters that provide an indication that the VCSELs on the wafer will most likely fail to meet their defined optical performance requirements. When implemented, the automated process scans the current (i) of each VCSEL and the temperature, and for each VCSEL, records the optical power L, laser diode voltage drop V, and optical spectrum (current vs. wavelength, spectral density, and characteristics of the emitted light).

DC values derived from the SORT procedure measurements (as defined with reference to the drawings) may include the following:
  The threshold current (Ith): the current above which the VCSEL starts stimulated light emission (laser radiation);
  The Slope Efficiency (SE): the incremental increase in power for an incremental increase in current;
  The optical power L at operation current (L_op): the optical power at a predetermined forward current above Ith;
  The spectral bandwidth (WL_SBW).

One, some, or all of the above-described values may also be referred to as VCSEL parameters. The VCSEL parameter(s) may be measured and used to define a value of a common performance characteristic, which can then be used to identify clusters of VCSELs on the wafer that have substantially similar common performance characteristics (e.g., values of common performance characteristics within a predefined amount of one another, within a standard deviation of one another, etc.).

In some embodiments, the values of these VCSEL parameters may impact the electro-optical (physical) properties of the VCSEL with respect to performance under modulation at a high rate, and may be strongly correlated with the aperture diameter and photon lifetime (as laser radiation in a cavity will have a finite lifetime because of losses at the cavity walls) of the VCSEL. These parameters have a distribution over the wafer, which is a result of variations of the physical attributes over the wafer.

According to the present disclosure, binning of VCSELs for large-scale wafer level analysis is performed by measuring representative VCSEL parameter(s) of predetermined DC or small signal values (which include low frequency AC signals with a limited amplitude at an operation point in which the VCSEL behaves essentially linearly, for each VCSEL on a wafer). A correlation between selected sub-groups of the representative parameters is then calculated and areas on the wafer, which contain clusters/sub-groups of VCSELs for which the calculated correlation meets a first condition, are identified. In some embodiments, an electro-optical property value (e.g., the aperture diameter and/or top/bottom mirror's reflectivity of the VCSEL) or a reliability value that is associated with each cluster is determined, based on the calculated correlation. In the context of this description the term "sub-group" refers to a set of parameters, but may also refer to a cluster of VCSELs having substantially values in the set of parameters. Specific correlations between such sub-groups can then be generated, and clusters of VCSELs to which such a correlation applies can be identified.

In one embodiment, clusters of VCSELs on the wafer with an aperture diameter that meets a second condition (e.g., a predefined aperture diameter requirement or aperture diameter threshold), and/or mirrors reflectivity that meets a third condition (e.g., a predefined reflectivity requirement or reflectivity threshold) are identified, and each identified cluster is associated with optical performance requirements from each of the VCSELs in the cluster, such that each identified cluster has at least a certain probability to meet its corresponding optical performance requirements.

As shown in FIG. 1, an illustrative system 100 for analyzing a wafer 104 having a plurality of VCSELs 108 is shown in accordance with at least some embodiments of the present disclosure. The system 100 is further shown to include a testing unit 116 that includes components that enable testing of the VCSELs 108 as described herein.

In some embodiments, the testing unit 116 includes a processor 120, memory 124, a VCSEL stimulator 136, and a VCSEL measurement unit 140. The VCSEL stimulator 136 may include a number of components that are capable of providing a stimulation to one or many VCSELs 108 on the wafer 104. Illustratively, but without limitation, the VCSEL stimulator 136 may include digital and/or analog circuitry that is configured to provide a stimulus in the form of DC signals and/or small signal measurement values (e.g., AC signals that are selected to cause the VCSELs 108 behave/respond linearly). As an example, the VCSEL stimulator 136 may include current sources, voltage source, electrical traces, electrical probes, analog circuitry, digital circuitry, or combinations thereof. The VCSEL stimulator 136 may apply stimulations to the VCSELs 108 on the wafer 104 in response to control signals or instructions received from the processor 120.

The VCSEL measurement unit 140 may be configured to measure VCSEL 108 responses to stimulations provided by the VCSEL stimulator 136 and provide the responses back to the processor 120 for further analysis and processing. The VCSEL measurement unit 140 may include one or more sensors that are configured to measure optical, physical, and/or electrical responses produced by the VCSELs 108. The VCSEL measurement unit 140 may also include circuitry configured to carry, amplify, and/or translate the measurements obtained by sensors and provide response signals to the processor 120 indicative of the VCSEL 108 responses.

As noted above, the processor 120 may be configured to coordinate operations of the testing unit 116. In some embodiments, the processor 120 may be configured to execute instructions stored in memory 124 to enable functionality of the testing unit 116 as described herein. Specifically, the memory 124 may include testing and analysis instructions 128 as well as quality control (QC) instructions 132. When executing the instructions, the processor 120 may be configured to operate the VCSEL stimulator 136 and VCSEL measurement unit 140. Upon receiving response signals from the VCSEL measurement unit 140, then processor 120 may further execute the testing and analysis instructions 128 to correlate measured VCSEL parameters to define a value of a common performance characteristic for the VCSELs 108 on the wafer 104. In some embodiments, based on the correlation of two or more VCSEL parameters measured by the VCSEL measurement unit 140, the processor 120 may determine whether a number of VCSELs 108 will meet (or fail to meet) an optical performance requirement defined for the VCSELs 108.

The processor 120 may also execute the QC instructions 132 to determine whether any quality control steps should be taken based on the results of executing the testing and analysis instructions 128. For example, if the measurement, correlation, and identification of clusters of VCSELs 108 results in a determination that a predetermined number (or ratio) of VCSELs 108 will not meet an optical performance requirement defined therefor, then the QC instructions 132 may enable the processor 120 to notify a technician of a faulty wafer 104. Alternatively or additionally, the QC instructions 132 may enable the processor 120 to take certain automated actions (e.g., automatically discard the wafer 104, automatically allow the wafer 104 to continue through further processing or testing, automatically stop the wafer 104 from further processing until a human inspection can be performed, etc.) in response to certain measurements and correlations obtained for the wafer 104. In this way, the processor 120 of the testing unit 116 may be configured to automatically test and analyze a number of VCSELs 108 on a wafer 104 and then determine whether the wafer 104 is suitable to pass certain quality control thresholds based on the analysis.

Figure 2:
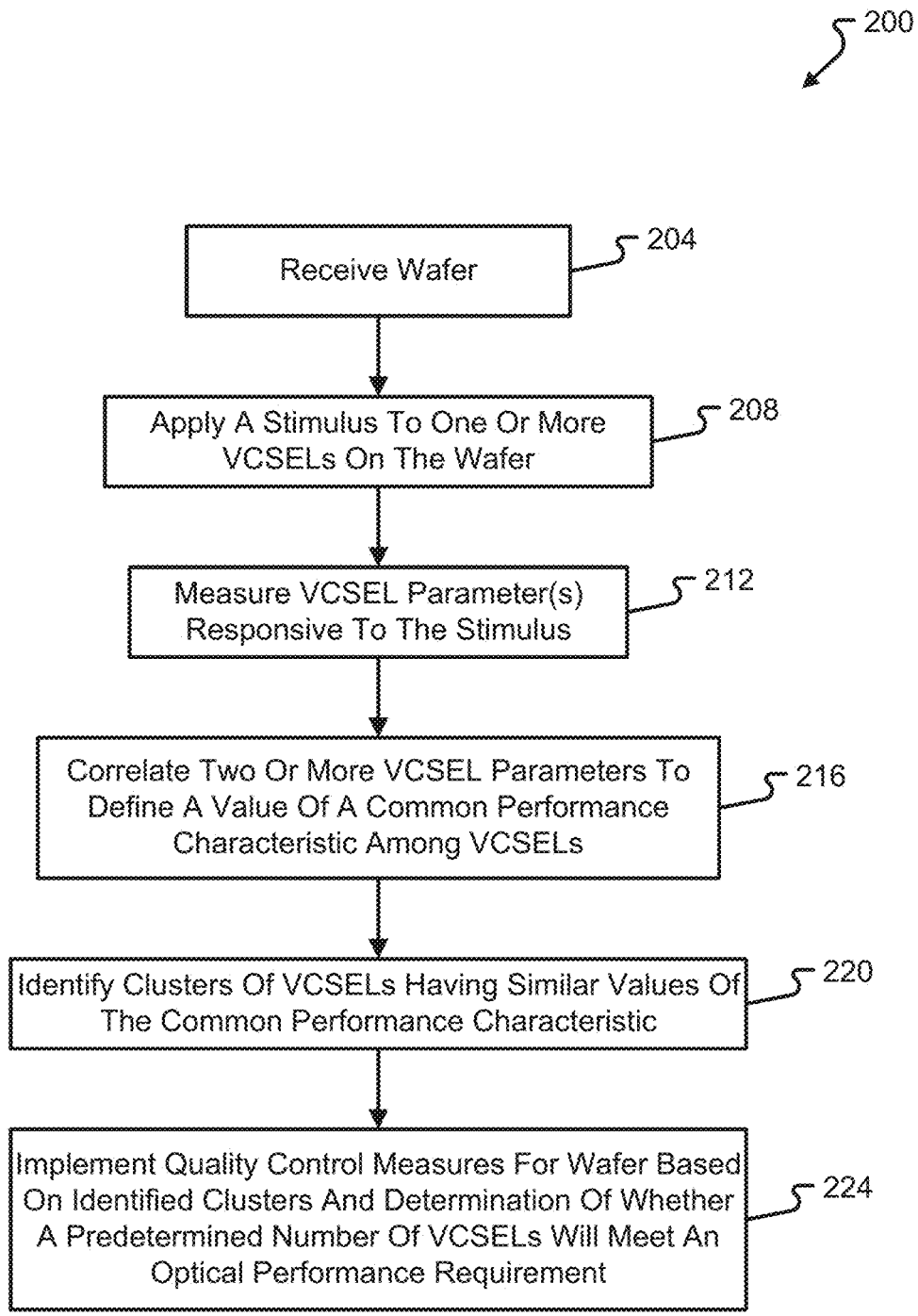
FIG. 2 is a flow diagram illustrating a method for binning VCSELs having individual performance characteristics on a wafer in accordance with embodiments of the present disclosure.

Additional capabilities and functions of the system 100 will now be described with reference to FIG. 2, which illustrates a method 200 for analyzing a plurality of VCSELs 108 having individual performance characteristics on a wafer 104. The method 200 begins when a wafer 104 is received at a test area 112 (step 204). The wafer 104 may be moved to the test area 112 via an automated conveyance or the test unit 116 may be movable toward the test area 112 where the wafer 104 is positioned.

The method 200 may continue with the VCSEL stimulator 136 applying a stimulus (or multiple stimuli) to one or more VCSELs 108 on the wafer 104 (step 208). The stimulus applied to the VCSELs 108 may include, without limitation, a DC input signal, an AC input signal, and/or a small signal measurement value (e.g., an AC input signal which causes the VCSELs 108 to behave substantially linearly).

The method 200 may then continue with the VCSEL measurement unit 140 measuring VCSEL parameter(s) created in response to the stimulus (step 212). In some embodiments, the VCSEL parameter(s) may include one or more of: L_op; Ith; SE; spectral bandwidth; photon lifetime; forward voltage; resistance; RIN; and S-parameters. As a non-limiting example, the VCSEL parameters may be selected from the group of: L_op between 4.05 and 4.6; Ith between 0.8 mA and 1.1 mA; SE between 0.56 and 0.68; and a spectral bandwidth between 0.7 and 1.2.

The processor 120 may obtain the measurement(s) of the VCSEL parameter(s) from the VCSEL measurement unit 140 and correlate two or more VCSEL parameters to define a value of a common performance characteristic among VCSELs 108 (step 216). In some embodiments, processor 120 may correlate the measured VCSEL parameter(s) to define the value of the common performance characteristic by applying a correlation matrix (see e.g., FIG. 9) to the measured VCSEL parameter(s). The correlation matrix, in some embodiments, may express the value of the common performance characteristic using a Pearson method.

The method 200 may then continue by identifying clusters of VCSELs 108 having similar values of the common performance characteristic (step 220). The clustering of VCSELs 108 may help to identify which areas on the wafer 104 have damaged, compromised, adequate, and/or exceptional VCSELs 108. As an example, the common performance characteristic may include a threshold value and/or an aperture size of a VCSEL 108. The method 200 may continue by determining an electro-optical property value associated with a cluster of VCSELs 108. The electro-optical property value may describe an aperture diameter and/or mirror reflectivity of the VCSELs 108.

Clusters of VCSELs 108 may be screened based on having an aperture diameter that meets (or fails to meet) a predefined aperture condition and/or having a mirror reflectivity that meets (or fails to meet) a predefined mirror reflectivity condition. Failure to meet one or both of these conditions may result in the processor 120 determining that the cluster of VCSELs 108 fails or will likely fail to meet a corresponding optical performance requirement defined for the VCSELs 108 (step 224). Examples of optical performance requirements that may be imposed on VCSELs 108 include, without limitation, expected data bit rate, expected bandwidth, expected modulation order, damping factor of relaxation oscillations, overshoots response, settling time, timing jitter, bit error rate, S-parameters, RIN, and spectral bandwidth.

If the VCSELs 108 are to be implemented in a particular transmission application, but are determined to not have a minimum probability of meeting optical performance requirements for the transmission application, then the VCSELs 108 and the wafer 104 may be identified damaged or may otherwise fail a quality control test. For instance, if the VCSELs 108 are being produced to work in a transmitter that operates at a bit rate that is greater than 50 Gbaud using a PAM4 modulation, but the VCSELs 108 do not produce outputs appropriate VCSEL parameters, then the VCSELs 108 may fail the testing method described herein.

While embodiments of the present disclosure describe the testing of VCSELs 108 that are configured to operate at a particular speed (e.g., 50 Gbaud PAM4), it should be appreciated that the system 100 is not limited to a particular performance requirement. For instance, the system 100 may test VCSELs 108 which are configured to operate using any number of suitable modulations (e.g., PAM4, PAM8, PAM16, NRZ, etc.).

Example

A wafer was manufactured then analyzed using the SORT procedure (as applied by system 100), to determine values of the parameters described below for different areas of the wafer 104. The results of this analysis are shown in FIGS. 3A-9.

Figure 3A:
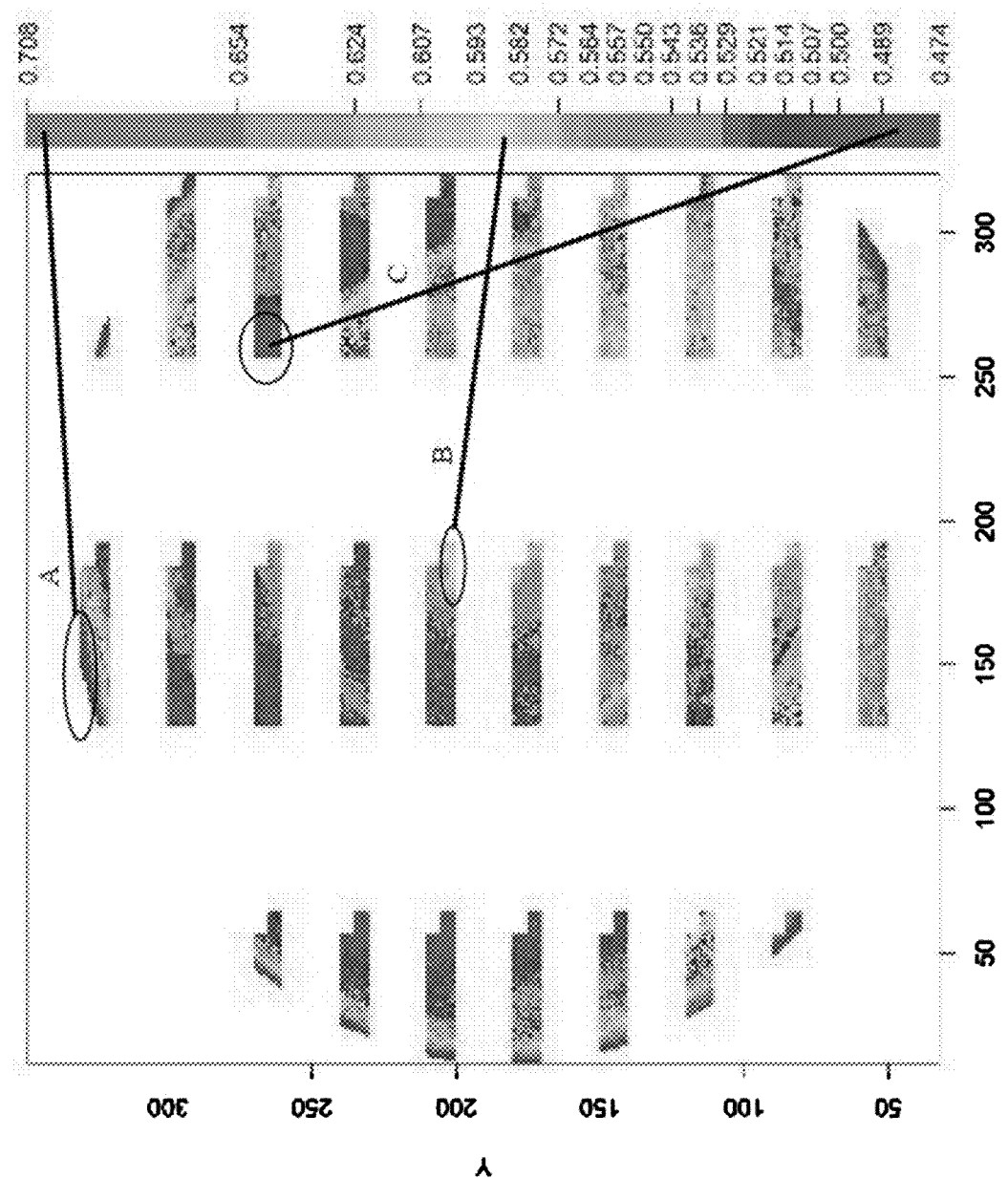
FIG. 3A illustrates the distribution of VCSELs over the wafer diameter, as a function of threshold current (Ith)

FIG. 3A illustrates the distribution of VCSELs over the wafer diameter, as a function of Ith, for 0.474 mA<Ith<0.708 mA. This figure shows a map of the wafer in which different clusters are identified according to a specific value. Maps of this type are typically in color, with different colors representing different values of the parameter shown. In FIG. 3A, three clusters are identified in circles in the figure. Cluster A consists of VCSELs having an Ith value of approximately 0.708 mA, Cluster B consists of VCSELs having an Ith value of approximately 0.582 mA, and Cluster C consists of VCSELs having an Ith value of approximately 0.480 mA.

Figure 4A:
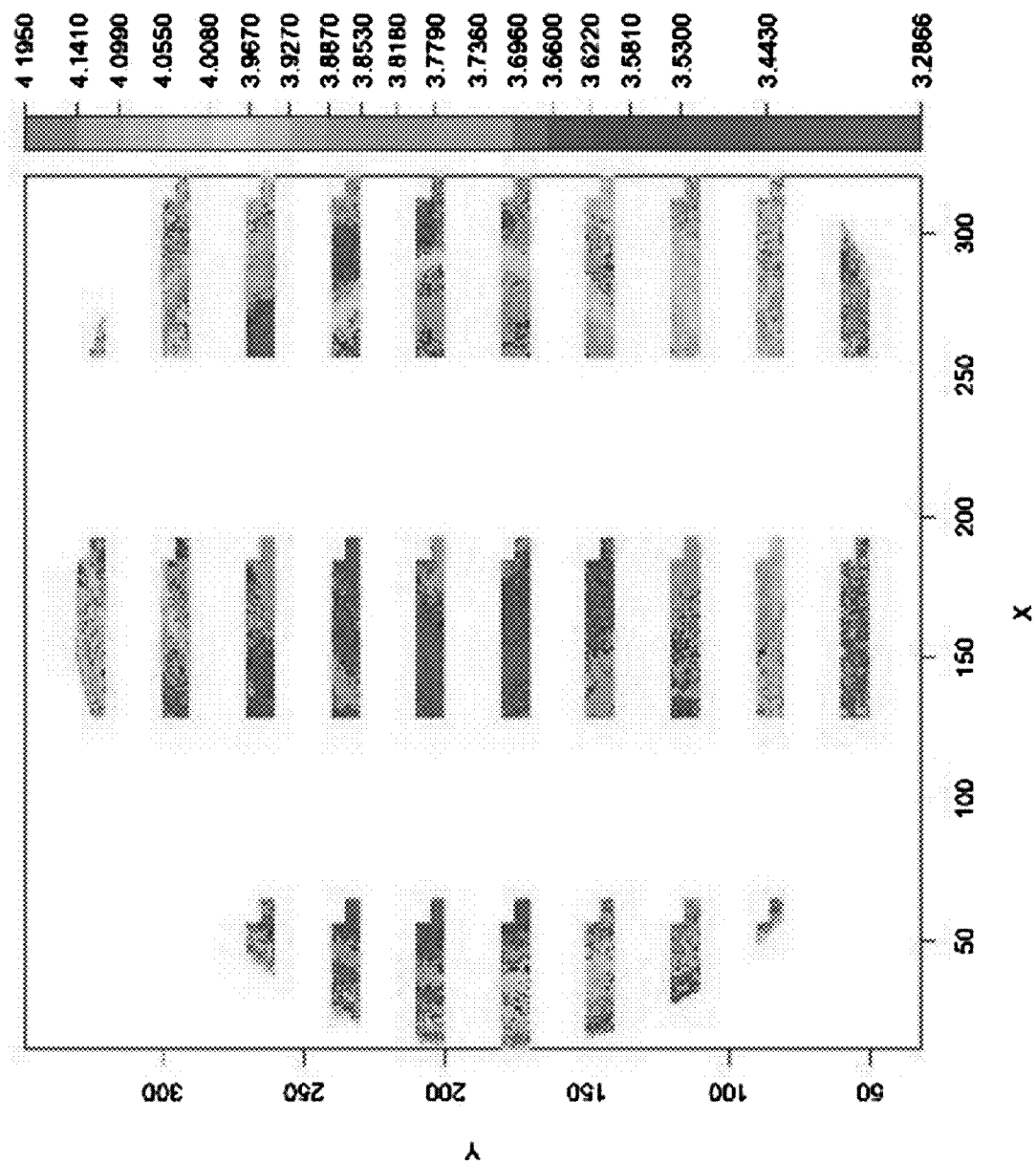
FIG. 4A illustrates the distribution of VCSELs over the wafer diameter, as a function of optical power L at operation current (L_op)
Figure 5A:
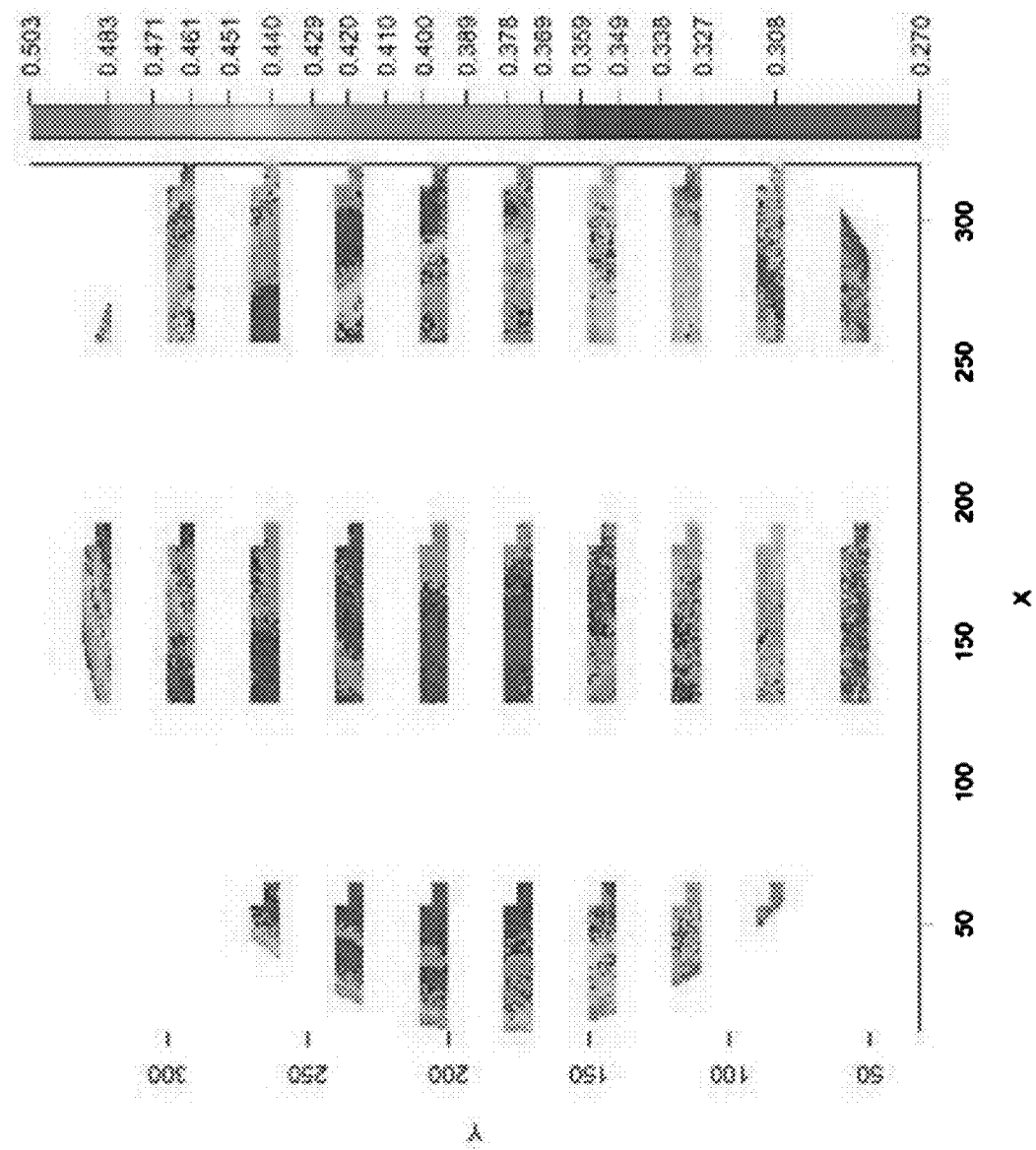
FIG. 5A illustrates the distribution of VCSELs over the wafer diameter, as a function of the Slope Efficiency (SE)
Figure 6A:
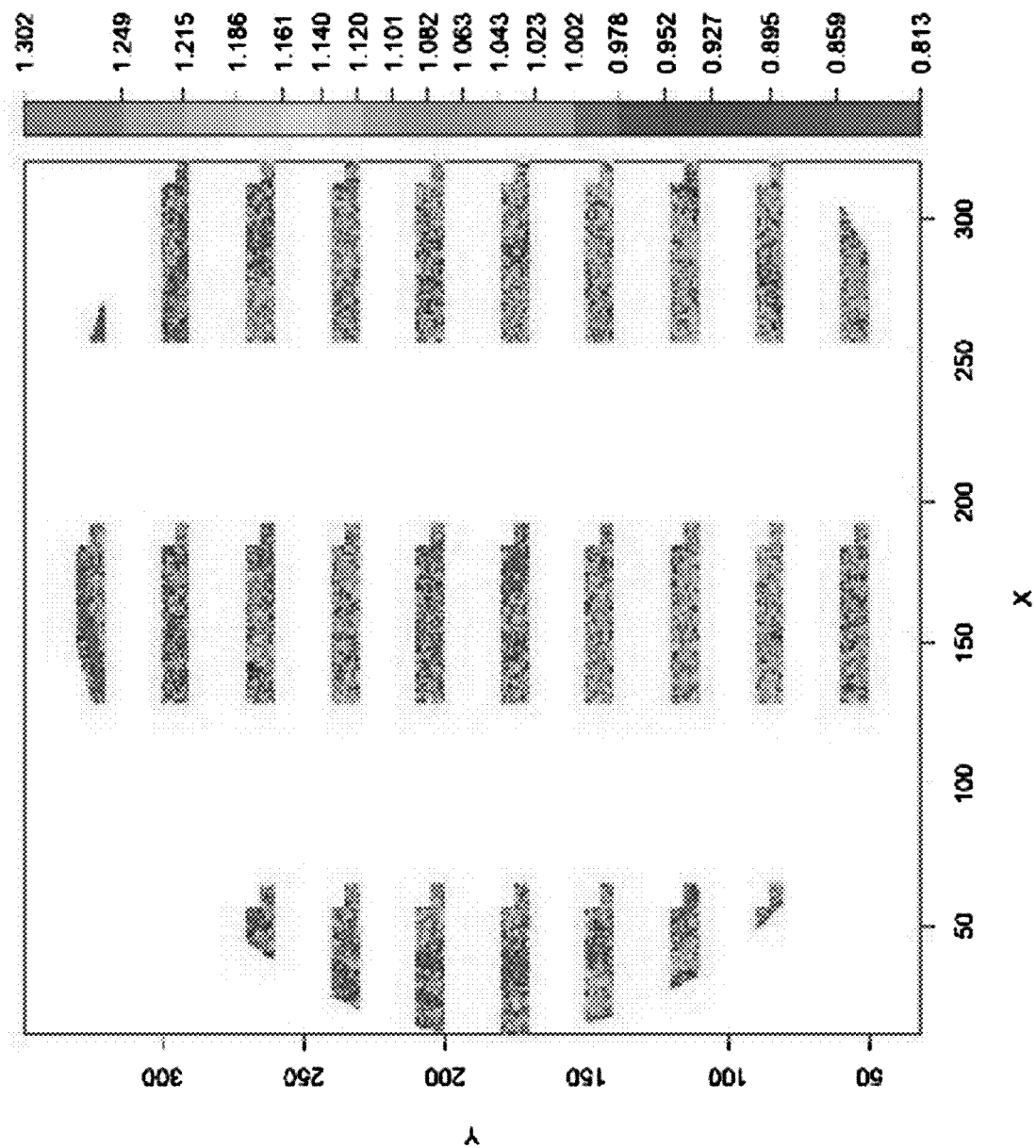
FIG. 6A illustrates the distribution of VCSELs over the wafer diameter, as a function of the spectral bandwidth (WL_SBW)

The same situation is applicable to FIG. 4A, FIG. 5A and FIG. 6A, for which the above explanation is not repeated, for the sake of brevity. A detailed description of these techniques is available, for instance, in the ISR Technical Report 2008-12, The Institute for Systems Research (http://citeseerx.ist.psu.edu/viewdoc/download?doi=10.1.1.874.6233&rep=rep1&type=pdf).

Figure 3B:
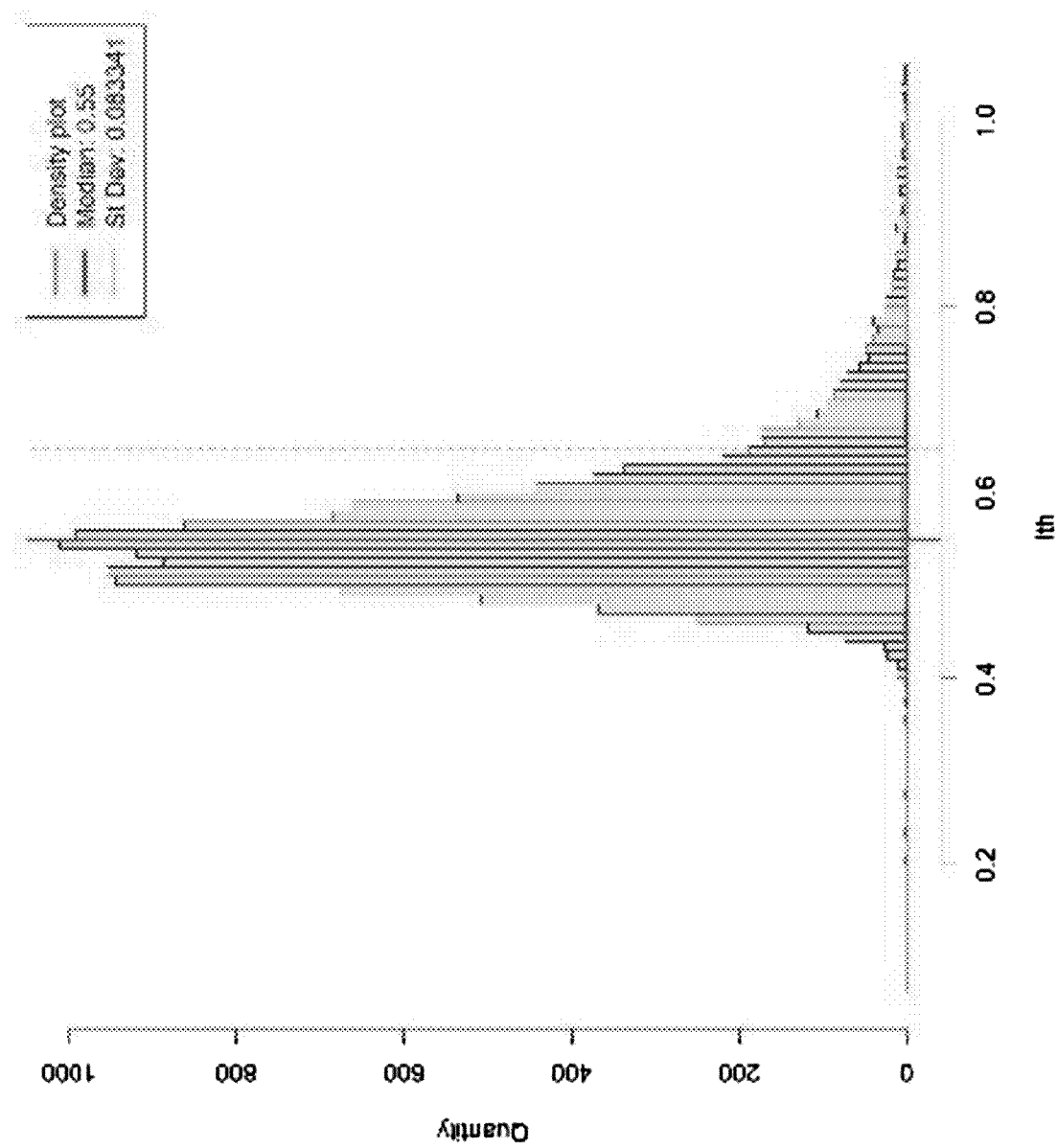
FIG. 3B is a density plot of the amount of VCSELs in the wafer as a function of Ith.

FIG. 3B is a density plot of the amount of VCSELs in the wafer as a function of Ith. It can be seen that the median value (about 1000 VCSELs) is about Ith=0.55 mA.

FIG. 4A illustrates the distribution of VCSELs over the wafer diameter, as a function of L_op, for 3.28 mW<L_op<4.195 mW, in a manner similar to FIG. 3A.

Figure 4B:
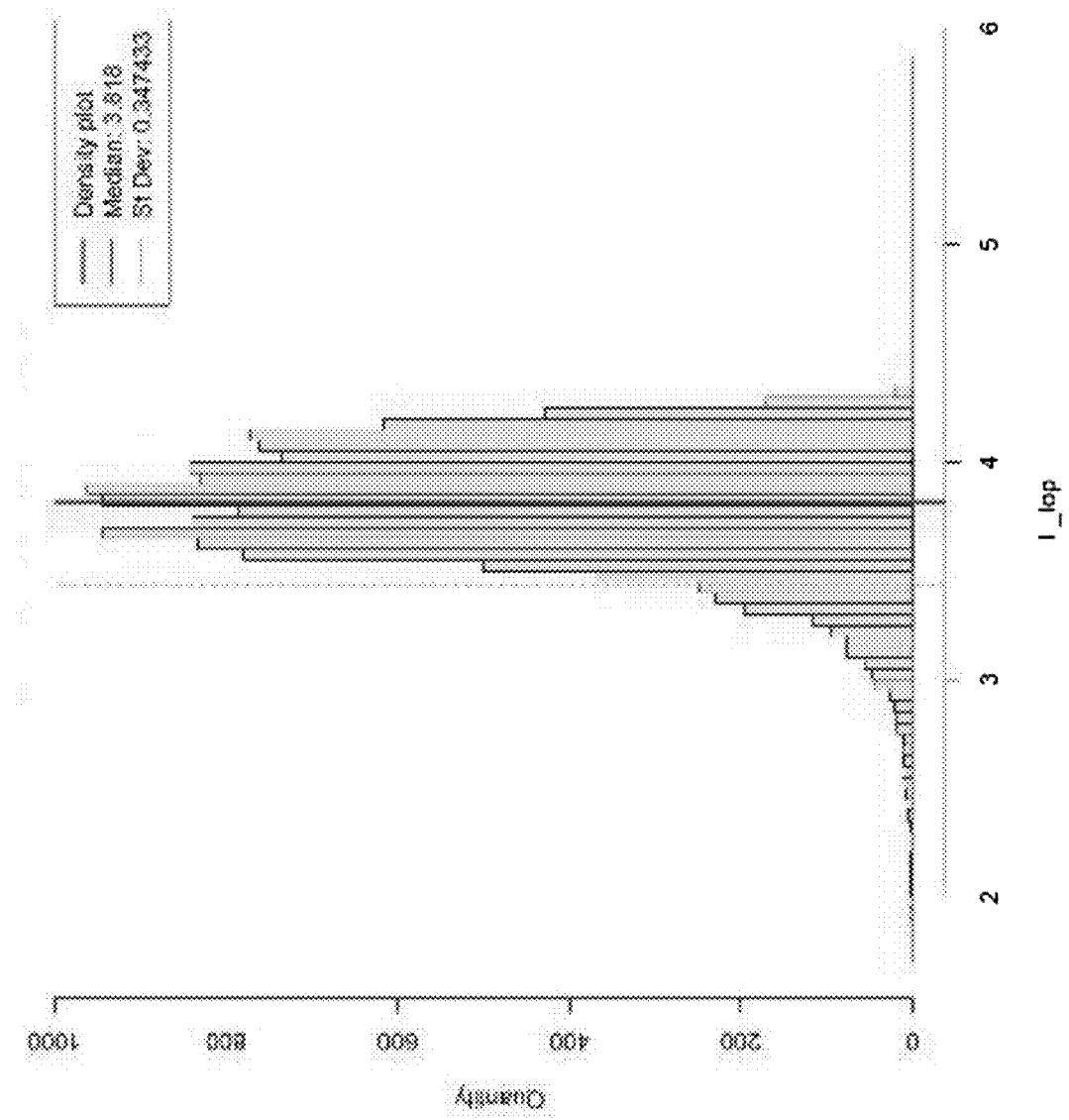
FIG. 4B is a density plot of the amount of VCSELs in the wafer as a function of L_op.

FIG. 4B is a density plot of the amount of VCSELs in the wafer as a function of L_op. It can be seen that the median value (about 900 VCSELs) is about L_op=3.818 mA.

FIG. 5A illustrates the distribution of VCSELs over the wafer diameter, as a function of the Slope Efficiency (SE), for 0.27 mW/mA<SE<0.5 mW/mA, in a manner similar to FIG. 3A.

Figure 5B:
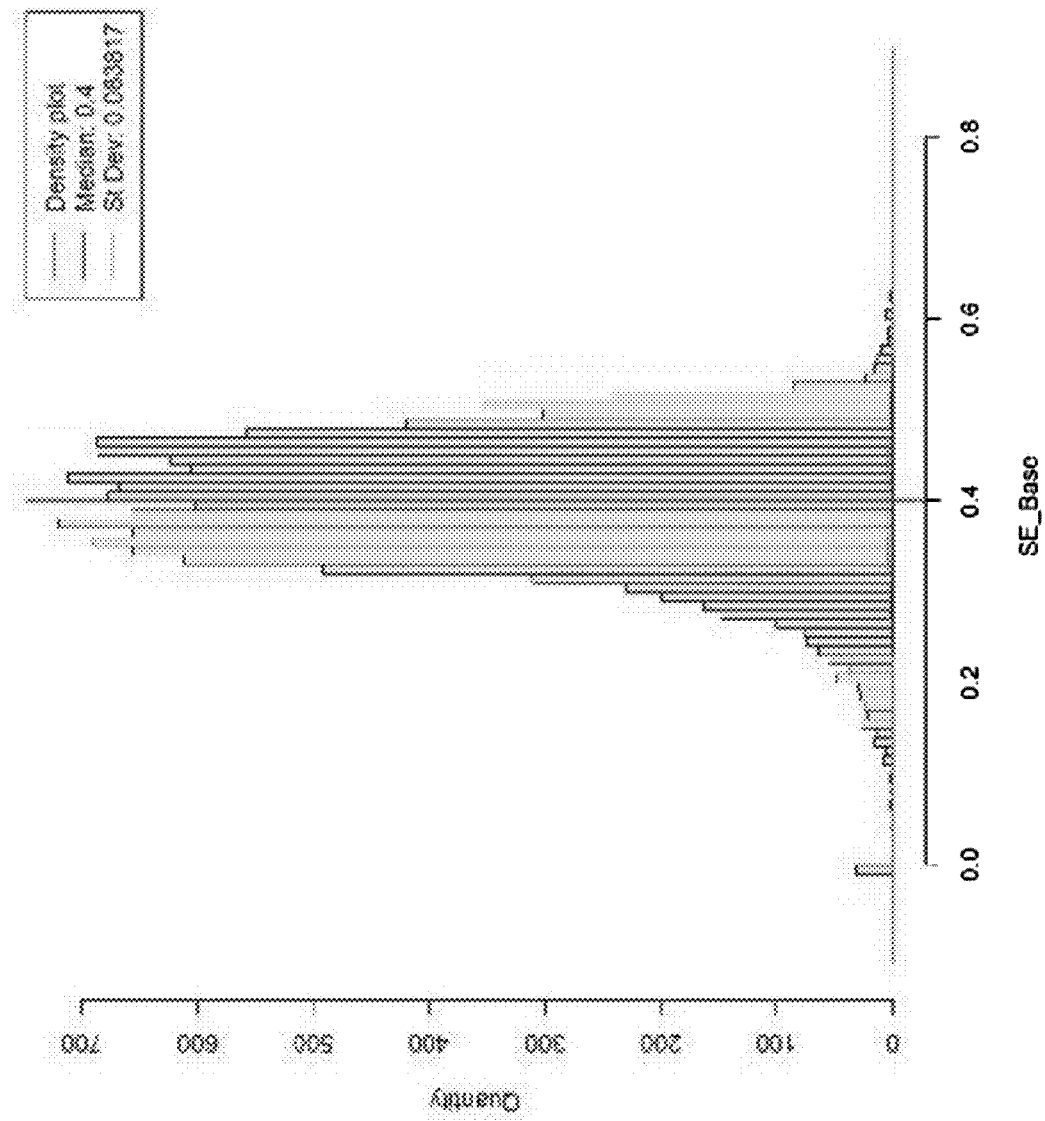
FIG. 5B is a density plot of the amount of VCSELs in the wafer as a function of SE.

FIG. 5B is a density plot of the amount of VCSELs in the wafer as a function of SE. It can be seen that the median value (about 650 VCSELs) is about SE=0.4 mW/mA.

FIG. 6A illustrates the distribution of VCSELs over the wafer diameter, as a function of the spectral bandwidth (WL_SBW), for 0.816 nm<WL_SBW<1.3 nm, in a manner similar to FIG. 3A.

Figure 6B:
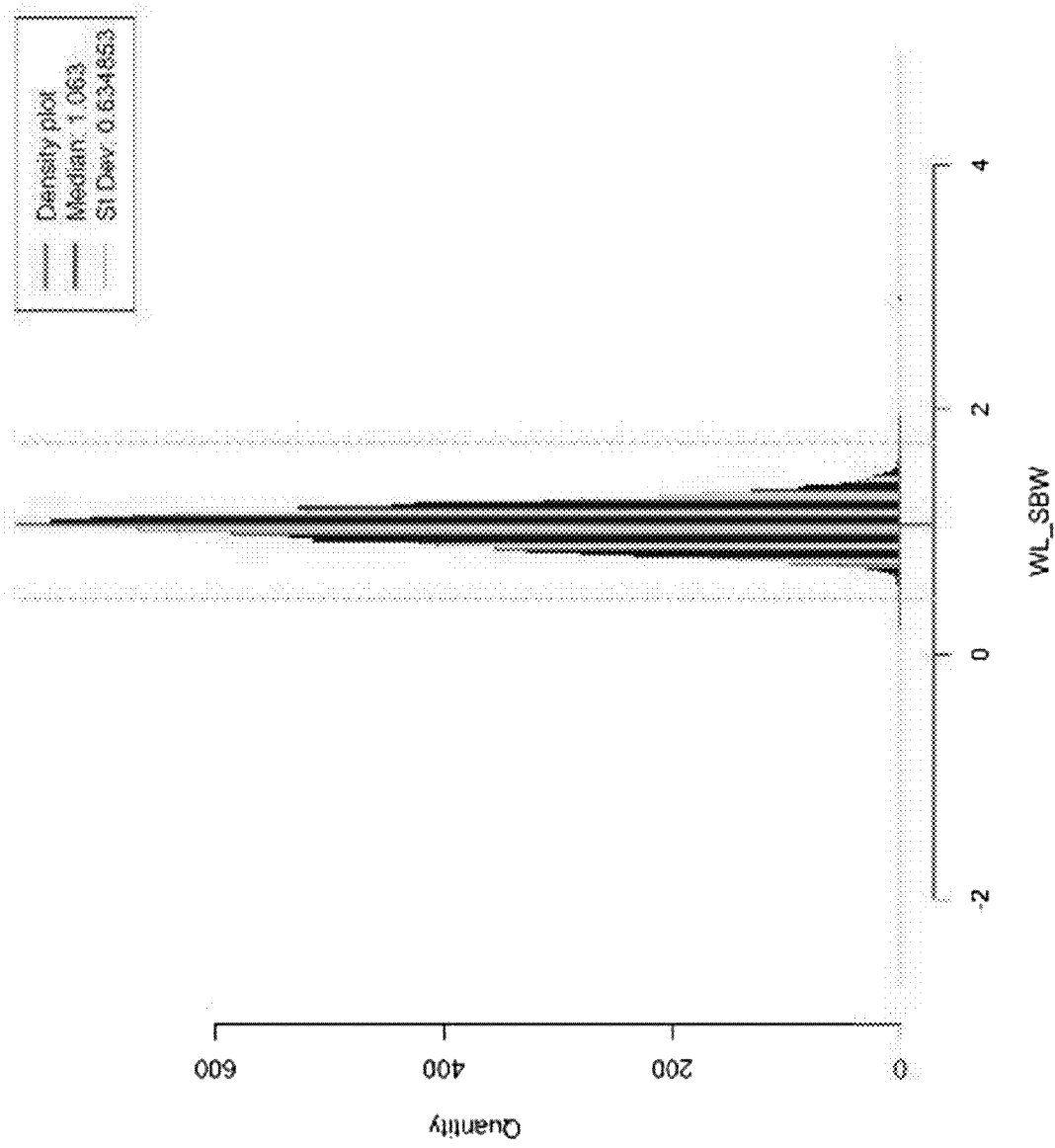
FIG. 6B is a density plot of the amount of VCSELs in the wafer as a function of WL_SBW.

FIG. 6B is a density plot of the amount of VCSELs in the wafer as a function of WL_SBW. It can be seen that the median value (about 800 VCSELs) is about WL_SBW=1.063 nm.

Figure 7:
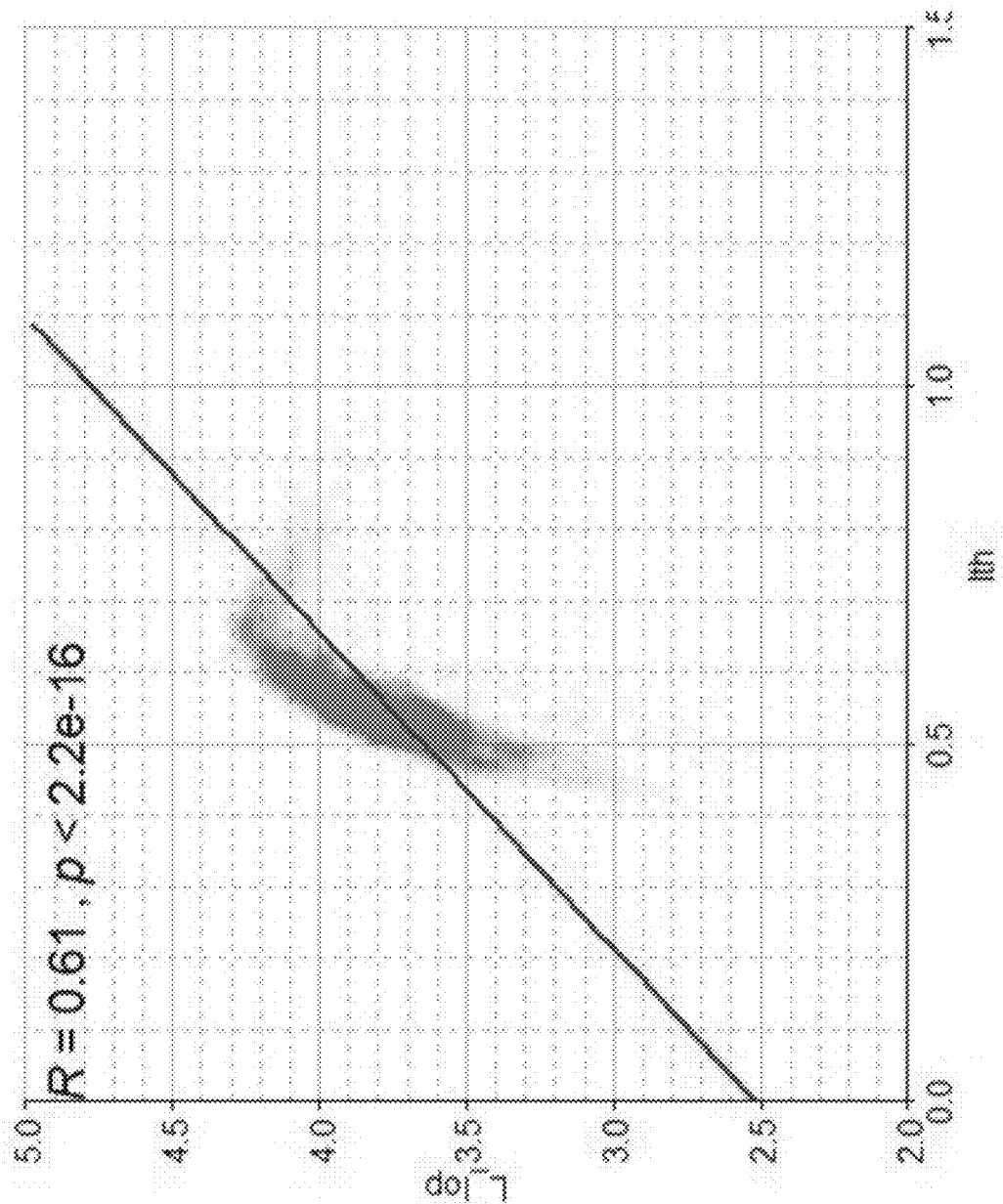
FIG. 7 illustrates the Pearson correlation between L_op and Ith, according to an embodiment of the disclosure.

To determine the values of inspected VCSEL parameters which give the better correlation, a correlation is made between the values of the various clusters (e.g., using the Pearson correlation or using other correlation techniques) and then the values representing the higher populated areas are selected. As an illustration, FIG. 7 shows the Pearson correlation between L_op and Ith.

Figure 8:
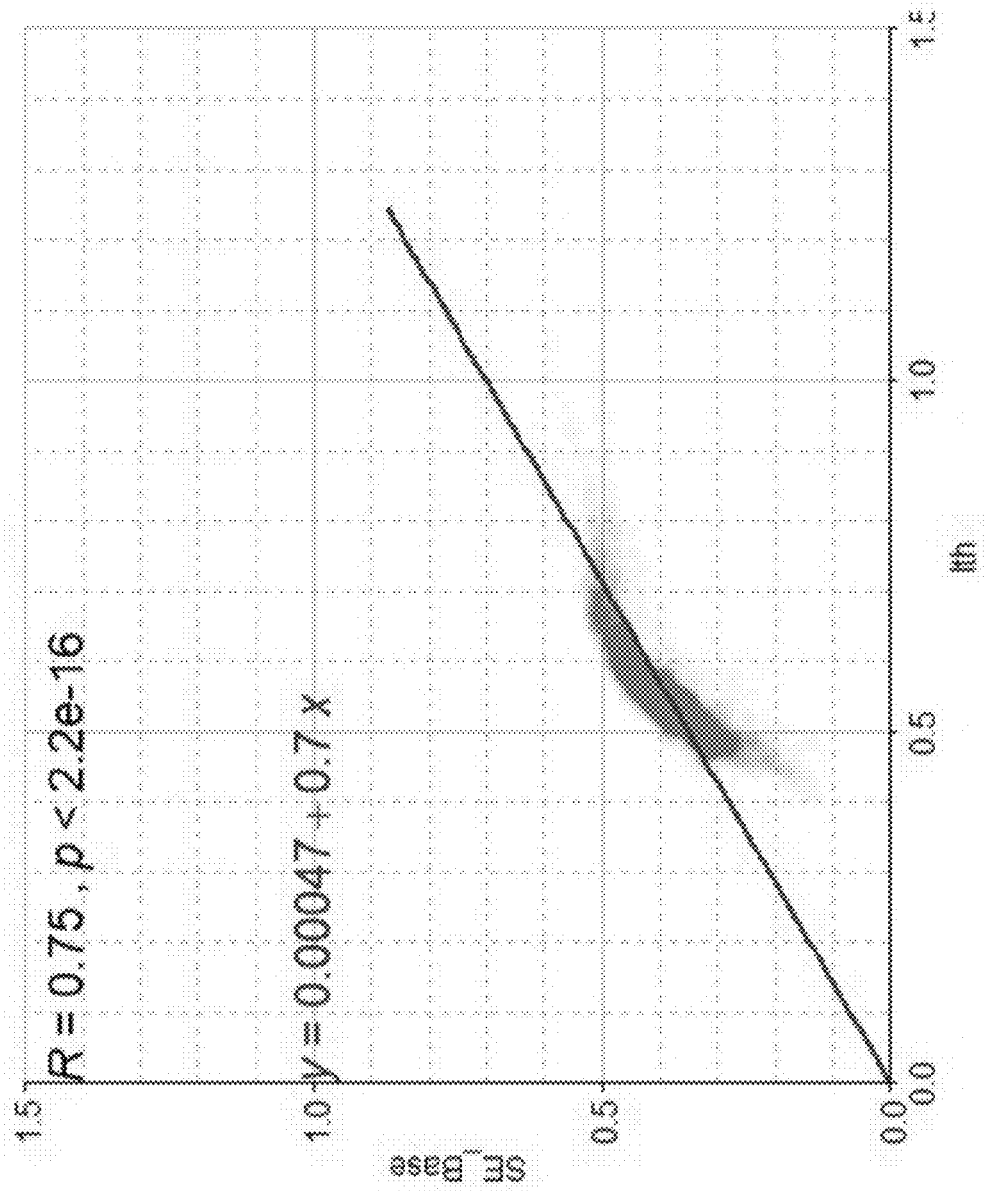
FIG. 8 illustrates the Pearson correlation between SE and Ith, according to an embodiment of the disclosure.

Similarly, FIG. 8 illustrates the Pearson correlation between the SE and the Ith. From the level of correlation between the L_op, the Ith, and the SE, it is possible to predict the aperture size of the VCSEL, without any direct measurement. Therefore, by looking at the dense areas of the correlation plots of FIGS. 7-8 (that reflect correlation between Ith and L_op and between Ith and SE), it is seen that dies with 0.45 mA<Ith<0.57 mA, 3.5 mW<L_op<3.7 mW, and 0.35 mW/mA<SE<0.38 mW/mA are suitable for selection. Such a selection may be used to identify and sort clusters of VCSELs on the wafer, with sufficiently small aperture size that will meet high rate and larger bandwidth requirements. The level of correlation provides an accurate indication of the predicted performance of each VCSEL under different modulation schemes (such as PAM4, PAM8, PAM16, NRZ, etc.).

Figure 9:
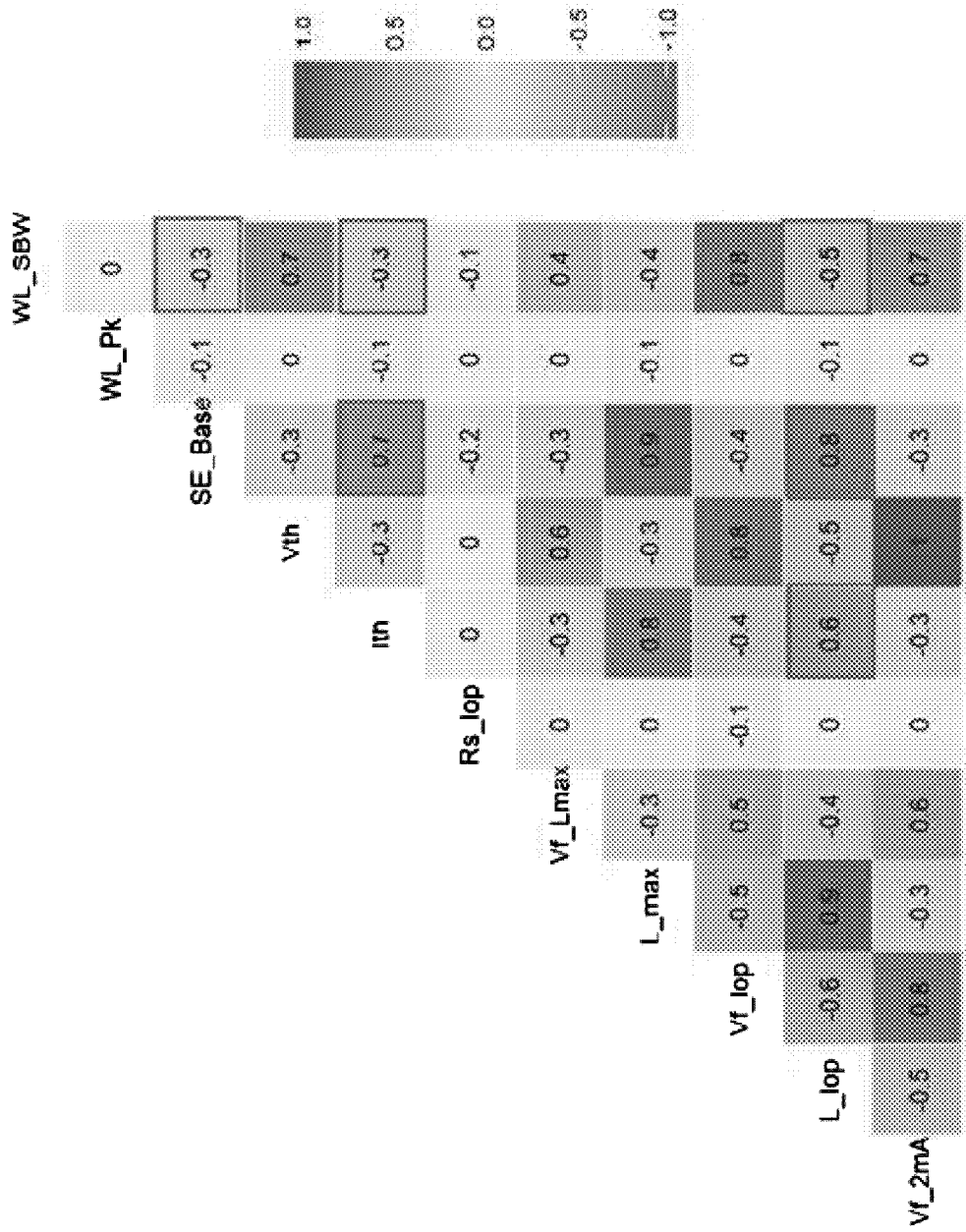
FIG. 9 is a correlation matrix showing the level of correlation between pairs of different parameters, according to an embodiment of the disclosure.

FIG. 9 illustrates a correlation matrix showing the level of correlation between pairs of different parameters, according to an embodiment of the disclosure. The initial correlations between different attributes are represented by a correlation matrix, which expresses the correlation coefficient, which was calculated in this illustrative example using the Pearson method, but as it will be apparent to the skilled person, other correlation methods can be used as well. In FIG. 9, values that are close to 1 reflect a higher correlation. High correlations between parameters increases the certainty regarding the physical properties of each examined VCSEL, as well as the probability to accurately predict the VCSEL's performance. Similarly, low correlation values are not sufficient for accurate predictions.

It can be seen that L_op, SE, and Ith are assumed to be correlated due to variations in the diameter of the VCSEL's oxide aperture. Since these variations are of the order of −1 m for oxide apertures of between 5-6 m, they are significantly related to the measured DC values. For 50 GBaud PAM4 modulation, the smaller apertures are favorable, as these values will increase bandwidth. As the spectral BW is derived directly from aperture diameter, by choosing dies with WL_SBW>0.9 smaller aperture diameters are preferred. Not all parameters have sufficient correlation and this matrix summarizes the results of the correlation procedures given above, for different sets of parameters. A color scale can also be provided, to give quick information on the level of correlation of each combination.

L_op, SE and Ith are also related by mirror reflectivity, which has dominant effect on photon lifetime. By choosing dies on the lower scale of the L_op/SE, sufficient damping of the relaxation oscillations is expected with high probability.

The method of processing the available DC values (derived from the SORT procedure), used by the present disclosure allows identifying areas on the wafer with high probability to meet certain requirements. For example, if the wafer 104 comprises 10,000 VCSELs 108, it will be possible to identify clusters of VCSELs 108 that will even exceed a specific design.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A method for binning Vertical-Cavity Surface-Emitting Lasers (VCSELs) having individual performance characteristics on a wafer, the method comprising:

measuring, for each VCSEL on the wafer, two or more VCSEL parameters responsive to Direct Current (DC) or small signal measurement values;
correlating, for each VCSEL on the wafer, the measured two or more VCSEL parameters to define a value of a common performance characteristic, wherein the correlation is indicative of a property of a VCSEL without directly measuring the property;
identifying clusters of VCSELs on the wafer having similar values of the common performance characteristic; and
screening the identified clusters of VCSELs based on one or more conditions associated with a VCSEL optical performance requirement.

2. The method of claim 1, wherein the small signal measurement values comprise Alternating Current (AC) signals at an operation point in which each VCSEL on the wafer behaves linearly.

3. The method of claim 1, wherein the value of the common performance characteristic comprises a threshold value.

4. The method of claim 1, wherein the property includes an aperture diameter of a VCSEL.

5. The method of claim 1, wherein the value of the common performance characteristic is obtained by correlating an optical power L at operation current (L_op), a threshold current (Ith), and a Slope Efficiency (SE).

6. The method of claim 1, further comprising:
determining a value of the property associated with a cluster of VCSELs based on the correlation of the measured two or more VCSEL parameters.

7. The method of claim 6, wherein the value of the property comprises a value for an aperture diameter.

8. The method of claim 6, wherein the value of the property comprises a value for mirror reflectivity.

9. The method of claim 1, wherein the one or more conditions comprises a predefined aperture condition, and wherein a screened cluster of VCSELs has at least a minimum probability to meet a corresponding VCSEL optical performance requirement.

10. The method of claim 1, wherein the one or more conditions comprises a predefined mirror reflectivity condition, and wherein
a screened cluster of VCSELs has at least a minimum probability to meet a corresponding VCSEL optical performance requirement.

11. The method of claim 1, wherein the VCSEL optical performance requirement comprises at least one of: expected data bit rate; expected bandwidth; expected modulation order; damping factor of relaxation oscillations; overshoots response; settling time; timing jitter; bit error rate; S-parameters; RIN;
and spectral bandwidth.

12. The method of claim 1, wherein the VCSELs are configured to operate at a bit rate that is greater than 50Gbaud PAM4.

13. The method of claim 1, wherein the VCSELs are configured to operate using a modulation of PAM4, PAM8, or PAM16.

14. The method of claim 1, wherein the two or more VCSEL parameters are selected from the group of: an optical power L at operation current (L_op); a threshold current (Ith); a Slope Efficiency (SE); a spectral bandwidth; a photon lifetime; a forward voltage; a resistance; a RIN; and S-parameters.

15. The method of claim 1, wherein correlating the measured two or more VCSEL parameters to define the value of the common performance characteristic comprises applying a correlation matrix to the measured two or more VCSEL parameters, wherein the correlation matrix expresses the value of the common performance characteristic using a Pearson method.

16. The method of claim 1, wherein the two or more VCSEL parameters are selected from the group of: an optical power L at operation current (L_op) between 4.05 mW and 4.6 mW; a threshold current (Ith) between 0.8 mA and 1.1 mA; a Slope Efficiency (SE) between 0.56 mW/mA (W/A) and 0.68 mW/mA (W/A); and a spectral bandwidth between 0.7 nm and 1.2 nm.

17. A method for analyzing a plurality of Vertical-Cavity Surface-Emitting Lasers (VCSELs) having individual performance characteristics on a wafer, the method comprising:
applying a stimulus to each of the plurality of VCSELs on the wafer;
measuring, for each of the plurality of VCSELs and with one or more sensors, two or more VCSEL parameters responsive to the stimulus;
correlating, for each VCSEL, the measured two or more VCSEL parameters to define a value of a common performance characteristic, wherein the value of the common performance characteristic comprises an aperture size of a VCSEL;
identifying clusters of VCSELs on the wafer having similar values of the common performance characteristic; and
screening the identified clusters of VCSELs based on one or more conditions associated with a VCSEL optical performance requirement.

18. The method of claim 17, wherein the stimulus comprises at least one of a Direct Current (DC) input signal and an Alternating Current (AC) signal small enough to cause a VCSEL to behave linearly.

19. The method of claim 17, wherein the value of the common performance characteristic is obtained by correlating an optical power L at operation current (L_op), a threshold current (Ith), and a Slope Efficiency (SE).

20. A system for analyzing a wafer having Vertical-Cavity Surface-Emitting Lasers (VCSELs), the system comprising:
a VCSEL stimulator that applies a stimulus to at least some VCSELs on the wafer;
one or more sensors that measure, for each of the at least some VCSELs, two or more VCSEL parameters responsive to the stimulus;
a processor; and
memory coupled with the processor that comprises instructions which, when executed by the processor, enable the processor to:
correlate, for each of the at least some VCSELs, the measured two or more VCSEL parameters to define a value of a common performance characteristic, wherein the value of the common performance characteristic comprises an aperture size of a VCSEL;
identify clusters of VCSELs on the wafer that have values of the common performance characteristic within a predefined amount; and
screening the identified clusters of VCSELs based on one or more conditions associated with a VCSEL optical performance requirement.

* * * * *